(12) United States Patent
Clark (10) Patent No.: US 6,869,329 B2
(45) Date of Patent: Mar. 22, 2005

(54) ENCAPSULATING OLED DEVICES WITH TRANSPARENT COVER

(75) Inventor: Thomas K. Clark, Walworth, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/131,628

(22) Filed: Apr. 24, 2002

(65) Prior Publication Data

US 2003/0203700 A1 Oct. 30, 2003

(51) Int. Cl.[7] .............................. H01J 9/00; H01J 9/24
(52) U.S. Cl. ............................... 445/25; 445/24
(58) Field of Search .................... 445/24, 25, 53, 445/54, 66; 438/26, 27, 127; 427/66

(56) References Cited

U.S. PATENT DOCUMENTS

| | | | | |
|---|---|---|---|---|
| 6,004,181 A | * | 12/1999 | Robinson | 445/70 |
| 6,331,488 B1 | * | 12/2001 | Doan et al. | 438/698 |
| 6,458,005 B1 | * | 10/2002 | Baker et al. | 445/24 |
| 6,497,598 B2 | * | 12/2002 | Affinito | 445/24 |
| 6,537,688 B2 | * | 3/2003 | Silvernail et al. | 428/690 |
| 6,554,672 B2 | * | 4/2003 | Dunham et al. | 445/25 |
| 6,580,090 B2 | * | 6/2003 | Barth et al. | 257/40 |
| 6,608,449 B2 | * | 8/2003 | Fukunaga | 315/169.3 |

* cited by examiner

Primary Examiner—Joseph Williams
Assistant Examiner—Dalei Dong
(74) Attorney, Agent, or Firm—Raymond L. Owens (57) ABSTRACT

A method for encapsulating one or more OLED devices with an transparent encapsulation cover, including placing an OLED device onto an alignment fixture; after the OLED device is aligned on the alignment fixture removing the aligned OLED device and placing the OLED device at an adhesive receiving position; using an adhesive dispenser to dispense adhesive at the adhesive receiving position at one or more predetermined locations on the OLED device; removing the adhesive containing OLED device from the adhesive dispenser and placing the adhesive containing OLED device in an encapsulation device; removing an transparent encapsulation cover from a storage cassette and positioning the transparent encapsulation cover in the alignment fixture; and moving the transparent encapsulation cover into an engaging relationship with the adhesive on the OLED device to secure the transparent encapsulation cover onto the OLED device.

6 Claims, 7 Drawing Sheets

ENCAPSULATING OLED DEVICES WITH TRANSPARENT COVER

FIELD OF THE INVENTION

The present invention relates to the encapsulation of OLED devices.

BACKGROUND OF INVENTION

In making organic light emitting devices (OLED) there are steps in which organic layers are deposited on or over a substrate. Organic light emitting devices are sensitive to moisture and contact damage and are commonly adhesively sealed in an inert atmosphere along with an encapsulation cover containing a desiccant material. The encapsulation cover is a transparent encapsulation cover similar in size to the OLED device glass having a strategically placed etched pocket or pockets containing desiccant. The transparent encapsulation cover has to be properly positioned with the OLED device. Another problem with sealing the transparent encapsulation cover to the OLED device is an over pressure condition caused when gases are compressed within the sealed region of the encapsulated OLED device requiring a vacuum controlled atmosphere. The transparent encapsulation cover and OLED devices are transported using robots. Previous art typically uses an encapsulation method having individual metal encapsulation covers individually located and sealed simultaneously to the OLED device. Another problem was the previous encapsulation device was limited to (1) device design and the use of metal encapsulation covers requiring a larger device format to accommodate the encapsulation cover.

SUMMARY OF THE INVENTION

It is an object of the present invention to provide an improved way of encapsulating OLED devices having the ability to encapsulate many device design formats and a single piece transparent encapsulation cover similar in size to the OLED device glass.

This object is achieved by a method for encapsulating one or more OLED devices with an transparent encapsulation cover, comprising the steps of:

(a) placing an OLED device onto an alignment fixture;

(b) after the OLED device is aligned on the alignment fixture removing the aligned OLED device and placing the OLED device at an adhesive receiving position;

(c) using an adhesive dispenser to dispense adhesive at the adhesive receiving position at one or more predetermined locations on the OLED device;

(d) removing the adhesive containing OLED device from the adhesive dispenser and placing the adhesive containing OLED device in an encapsulation device;

(e) removing an transparent encapsulation cover from a storage cassette and positioning the transparent encapsulation cover in the alignment fixture; and (f) moving the transparent encapsulation cover into an engaging relationship with the adhesive on the OLED device to secure the transparent encapsulation cover onto the OLED device.

It is an advantage of the present invention to provide for encapsulation of an OLED device and in the process of encapsulation capture an inert atmosphere.

It is a further advantage of the present invention to provide an encapsulation method which can accurately position the transparent encapsulation cover on an OLED device. This encapsulation process can be provided by an automated process.

DETAILED DESCRIPTION OF THE PREFERRED EMBODIMENT

Figure 1:
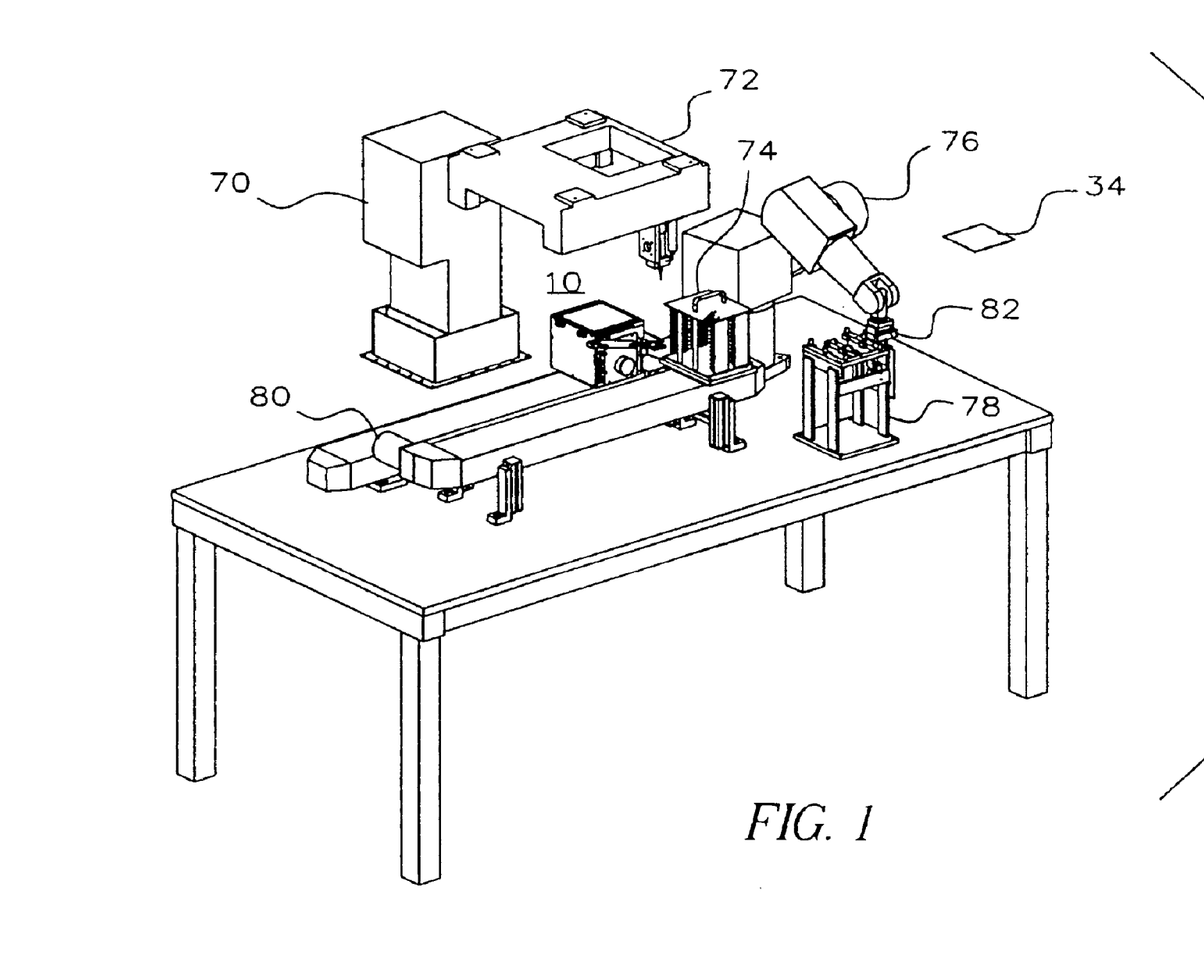
FIG. 1 is an assembly drawing of an apparatus for practicing the present invention.

FIG. 1 is an assembly drawing of apparatus that includes an encapsulation device 10. A description of the process practiced by this apparatus is described in sequence. An OLED device 34 is transported from a handling position by a robotic arm 76 using a vacuum operated pick-up tool 82 to a alignment fixture 78. The OLED device 34 is positioned in the alignment fixture 78 and released by the pick-up tool 82. The robotic arm 76 moves the pick-up tool 82 away from the OLED device 34. The alignment fixture 78 aligns the OLED devise 34 to a fixed location. The robotic arm 76 and the pick-up tool 82 return to the OLED device 34. The OLED device 34 is removed from the alignment fixture 78 by the pick-up tool 82 and transported to an adhesive receiving position adjacent to an adhesive dispenser 72 and adhesive 36 is dispensed at the adhesive receiving position on the OLED device 34 at one or more predetermined locations.

Figure 2:
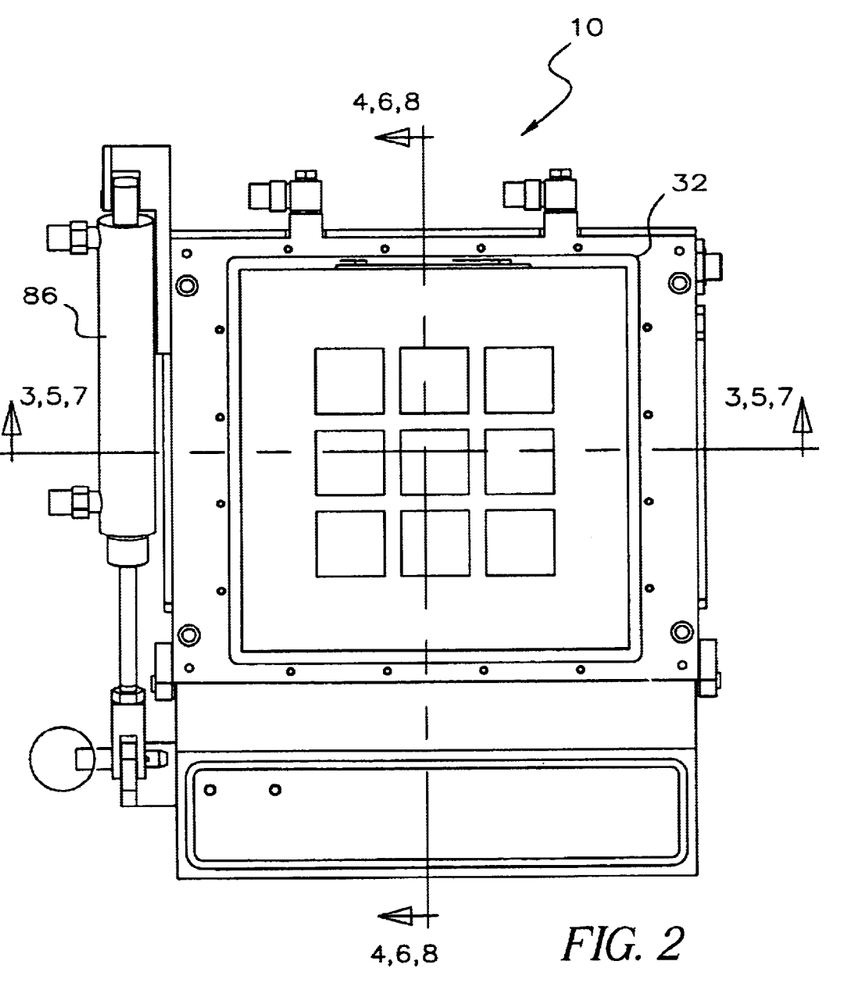
FIG. 2 is a top view of an encapsulation device shown in FIG. 1 for encapsulation in accordance with the present invention.

The OLED device 34 with adhesive 36 applied is transported to the encapsulation device 10 (see FIG. 2). The OLED device 34 is positioned on a lower vacuum plate 22 inside encapsulation device 10 having the adhesive 36 facing up. The vacuum plate 22 applies a hold down vacuum to position the transparent encapsulation cover 32 relative to the adhesive bearing OLED device 34. The robotic arm 76 with the pick-up tool 82 exits encapsulation device 10 and move to a storage cassette 74. The pick-up tool 82 then removes a transparent encapsulation cover 32 from the storage cassette 74 and moves such transparent encapsulation cover 32 to the alignment fixture 78. The transparent encapsulation cover 32 is located in the alignment fixture 78 and is released by the pick-up tool 82. The transparent encapsulation cover 32 now is aligned to a fixed location. Thereafter, the transparent encapsulation cover 32 is removed from the alignment fixture 78 by pick-up tool 82 and transported to the encapsulation device 10. The transparent encapsulation cover 32 is then positioned in a predetermined location on a transparent upper vacuum plate 20 located in encapsulation device 10.

The pick-up tool 82 releases the transparent encapsulation cover 32 and exits encapsulation device 10. The encapsulation device 10 with the OLED device 34 and the transparent encapsulation cover 32 located in position are ready for the encapsulation process to begin. The encapsulation device 10 is hermetically sealed facilitated by a door cylinder 86 so the interior of the encapsulation device 10 can be subject to a vacuum. The encapsulation device 10 is transported by a transport conveyor 80 to an adhesive cure station 70. Preferably, ultraviolet light is applied at the adhesive curing station 70 to an encapsulated OLED device 84 which cures the adhesive 36. The transparent encapsulation cover 32 is now sealed to the OLED device 34.

At the completion of the curing process the encapsulation device 10 returns to its initial position adjacent to the storage cassette 74. The hermetic seal of encapsulation device 10 is opened and the encapsulated OLED device 84 is removed from the encapsulation device 10 using the robotic arm 76 and the pickup tool 82 and transported to the encapsulation cover and encapsulated OLED device storage cassette 74. The encapsulation process is now complete.

The encapsulation process of encapsulation device 10 will now be discussed. The encapsulation has three basic process positions.

A first process position 88 (see FIGS. 3 and 4) is the loading and unloading position where OLED device 34 and transparent encapsulation cover 32 are loaded into the encapsulation device 10. The encapsulated OLED devices 84 are unloaded after encapsulation is completed.

In a second process position 90 (see FIGS. 5 and 6) the encapsulation device 10 is hermetically sealed and vacuum is introduced in the form of an inert gas. The OLED device 34 and the transparent encapsulation cover 32 are located in close proximity but not in contact.

In a third process position 92 (FIG. 7) the OLED device 34 with adhesive 36 is pressed against the transparent encapsulation cover 32 compressing the adhesive 36 and trapping inert gas in a vacuum state between the OLED device 34 and the transparent encapsulation cover 32. The adhesive 36 is cured with ultra violet light using adhesive cure station 70.

Figure 7:
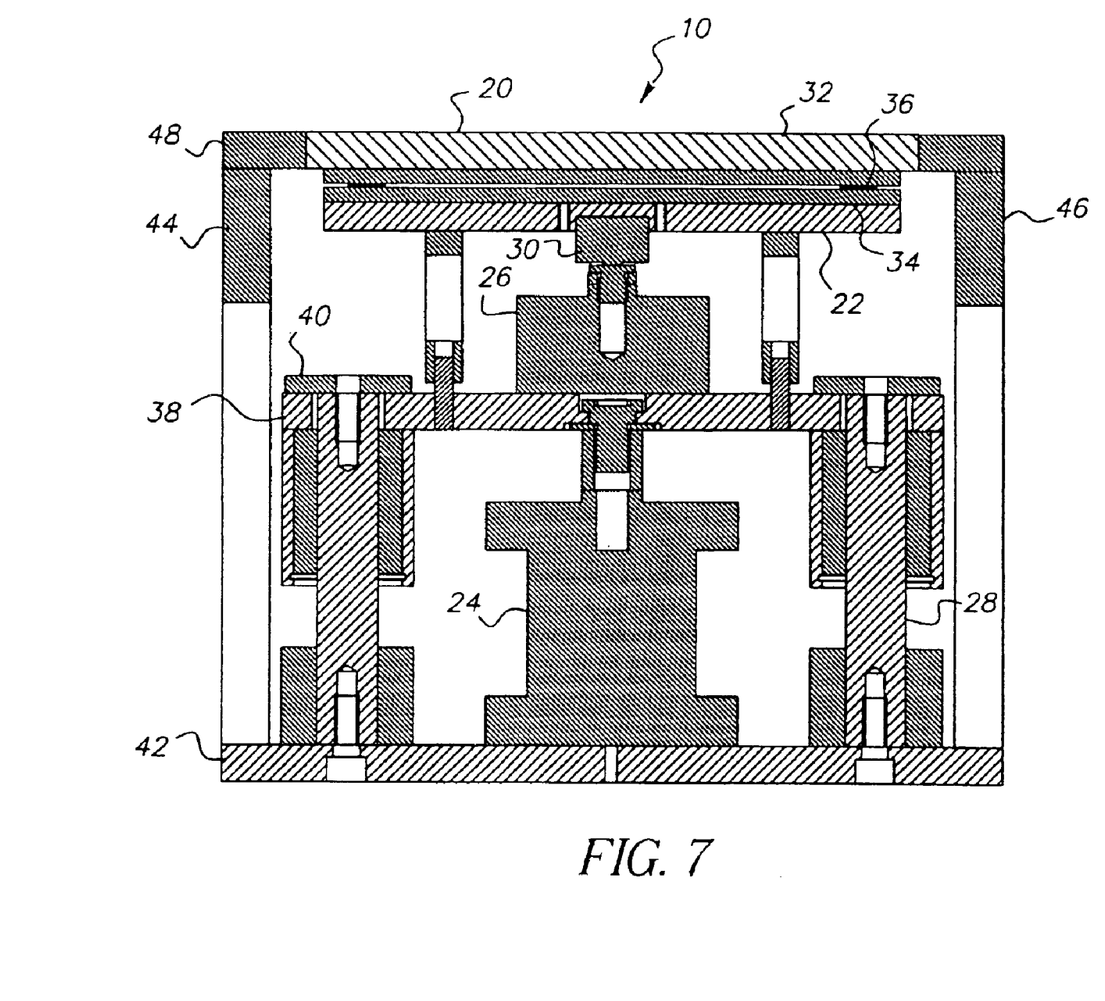
FIG. 7 is a cross-sectional view taken along lines 7—7 of FIG. 2.

The encapsulation process is now complete and the encapsulation device 10 returns to the first process position 88 repeating the process steps in reverse order and the encapsulated OLED device 84 is removed from the encapsulation device 10.

Figure 3:
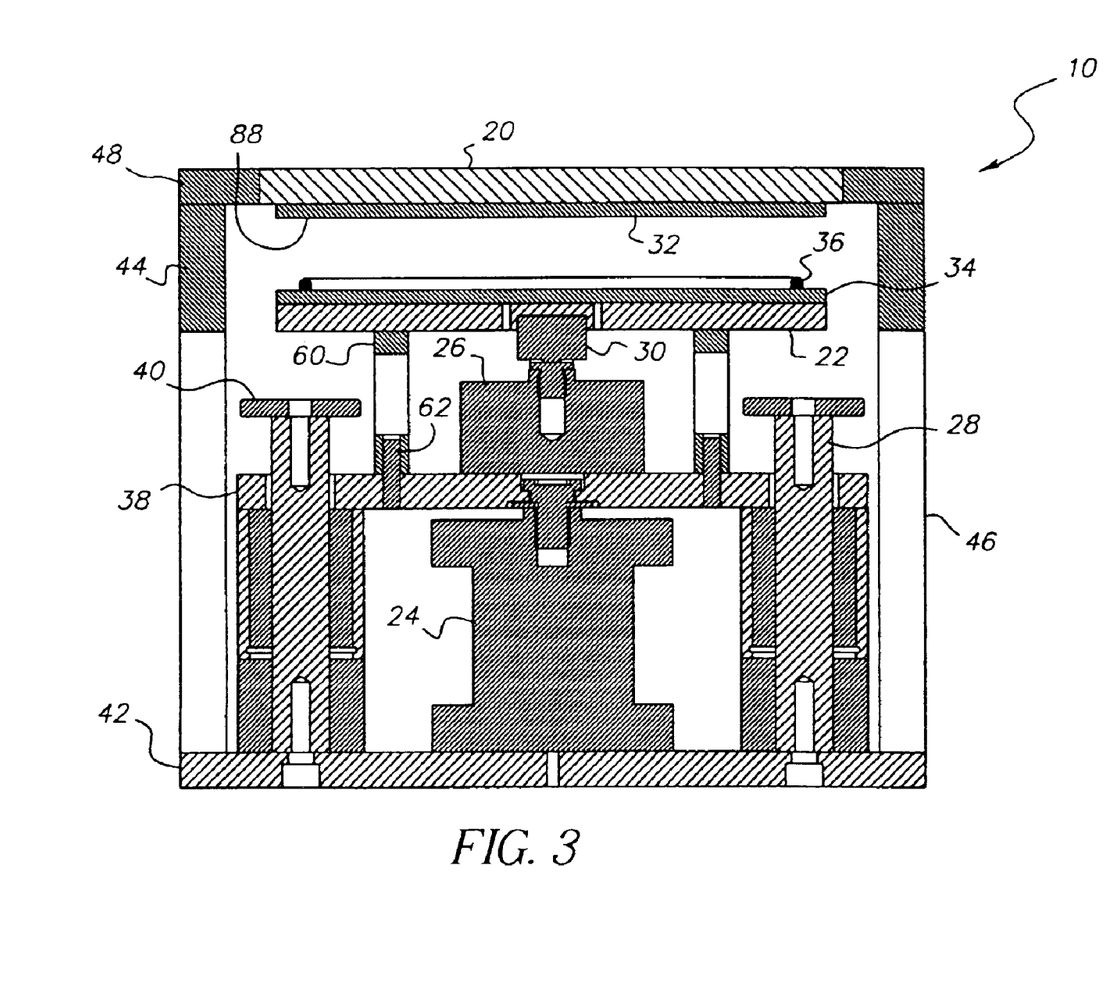
FIG. 3 is a cross-sectional view taken along lines 3—3 of FIG. 2.

FIG. 3 depicts a front cross-sectional view taken along lines 3-3 of FIG. 2 of the encapsulation device 10. The encapsulation device 10 is depicted in the first process position 88 the loading and unloading position. The encapsulation device 10 having a transport cylinder 24 retracted and a encapsulation cylinder 26 retracted. The OLED device 34 is located in position on a lower vacuum plate 22 having adhesive 36 previously applied at the adhesive dispenser 72. The OLED device 34 and the adhesive 36 are depicted larger than scale for clarity of illustration.

A transparent encapsulation cover 32 is located in position and held in place by vacuum on a transparent upper vacuum plate 20. The transparent encapsulation cover 32 is depicted larger than scale for clarity of illustration. Also depicted in FIG. 3 are a base plate 42, a left hand side plate 44, a right hand side plate 46, and a vacuum plate frame 48 that form the framework of the encapsulation device 10. Also shown is a lower platen 38 that is raised and lowered during the encapsulation process by the transport cylinder 24 and guided and positioned by two die pins 28. The lower platen 38 when raised by the transport cylinder 24 is stopped at a fixed location when contacting two lower platen stops 40. Mounted to the top surface of the lower platen 38 are two lower vacuum plate supports 60, four guide pins 62 only two of which are shown, and the encapsulation cylinder 26. The operating sequence will be described in detail in following figures.

Figure 4:
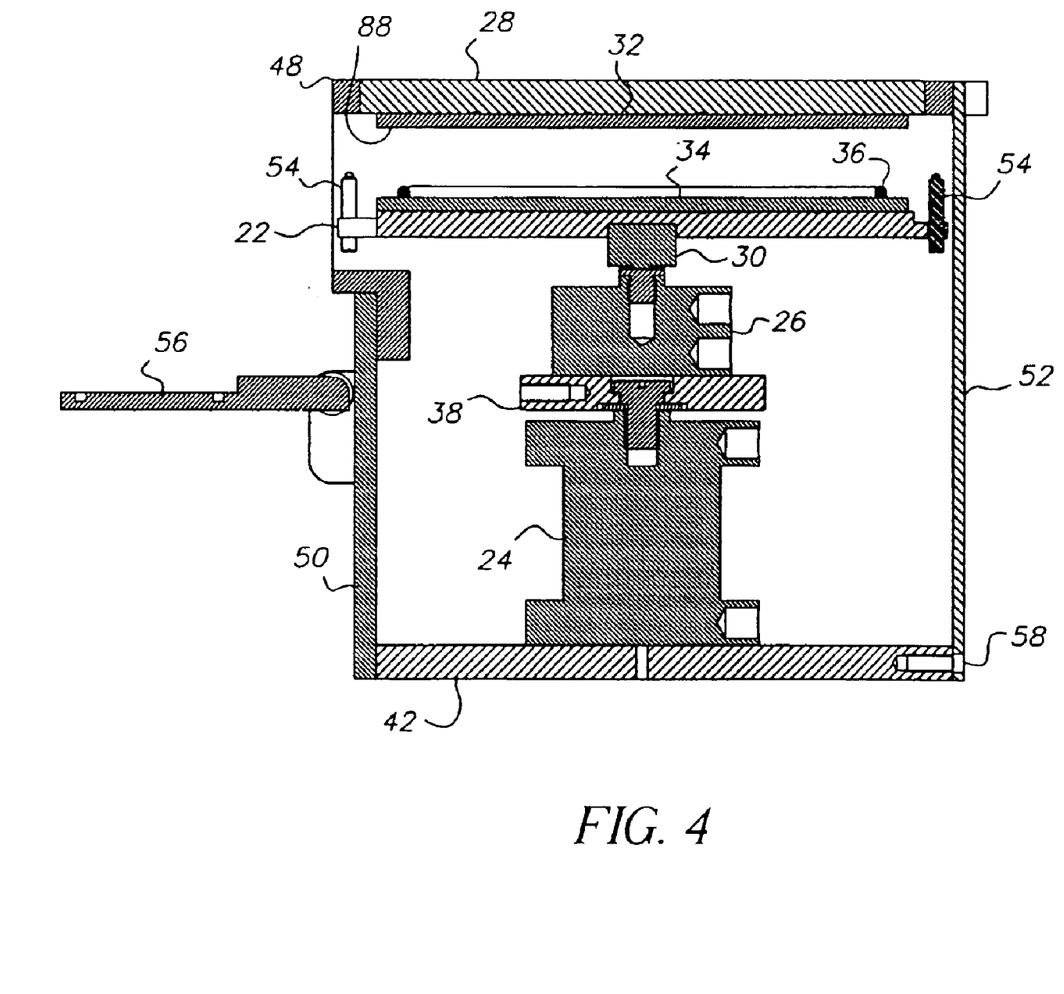
FIG. 4 is a cross-sectional view taken along lines 4—4 of FIG. 2.

FIG. 4 is a side cross-sectional view taken along lines 4—4 of FIG. 2 of the encapsulation device 10. The encapsulation device 10 is depicted in the first process position 88 having the transport cylinder 24 retracted and the encapsulation cylinder 26 retracted. A front cover 50 and a rear cover 52 are depicted and are fastened to the base plate 42, the vacuum plate frame 48, the left hand side plate 44, and the right hand side plate 46 using fasteners 58 represented in only one location for clarity of illustration. A door 56 is attached to the front cover 50. The door 56 is depicted in the open position. The encapsulation device 10 is enclosed on all four sides, and the top and bottom. The encapsulation device 10 preferably is hermetically sealed when the door 56 is closed.

The OLED device 34 and the transparent encapsulation cover 32 are oriented in the encapsulation device 10 through the door 56 in the open position. The encapsulated OLED device 84 is then removed through the door 56 in the open position. Three spring plungers 54 two of which are shown in three locations mounted to the lower vacuum plate 22. The spring plunger 54 is a threaded device. The spring plungers 54 are fastened to vacuum plate 22 in threaded holes located on vacuum plate 22. The function of the spring plungers 54 will be explained in detail FIG. 6. Also depicted in FIG. 4 a pressure transducer 30 positioned on the bottom side of vacuum plate 22. The function of the pressure transducer 30 will be described in detail in FIG. 7.

Figure 5:
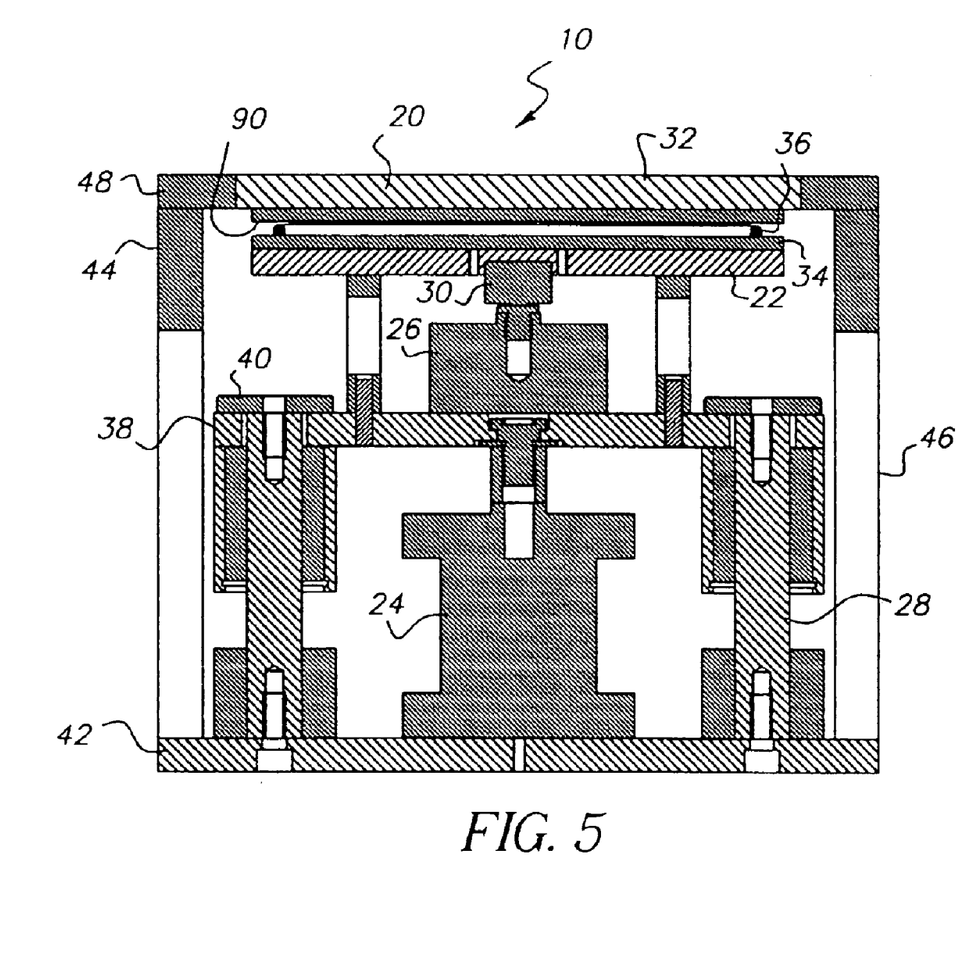
FIG. 5 is a cross-sectional view taken along lines 5—5 of FIG. 2.

FIG. 5 is a front cross-sectional view taken along lines 5—5 of FIG. 2 of the encapsulation device 10. This figure depicts the second process position 90 with the transport cylinder 24 actuated in the up position. The lower platen 38 guided by die pins 28 is raised to the lower platen stops 40. The transport cylinder 24 remains actuated applying continuous pressure to the lower platen 38 located against lower platen stops 40.

Figure 6:
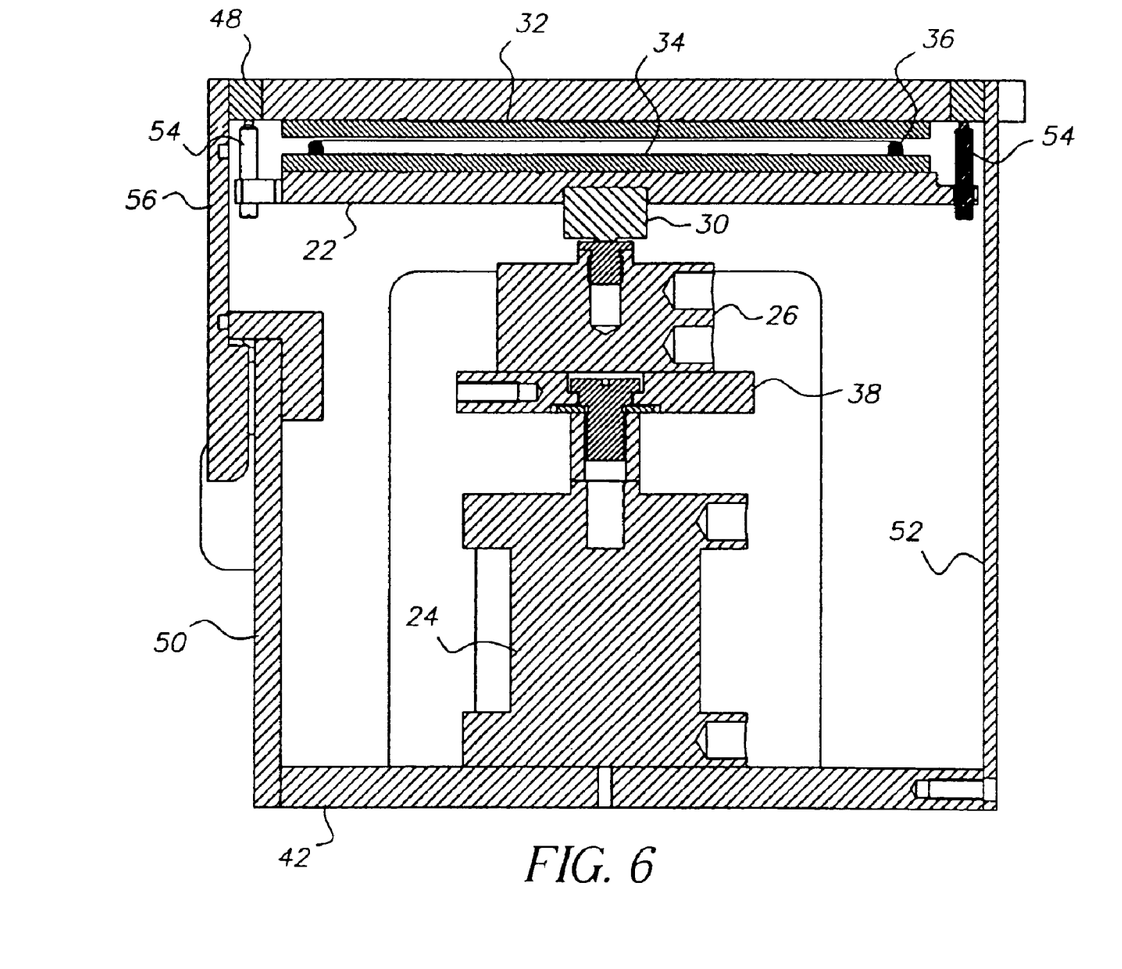
FIG. 6 is a cross-sectional view taken along lines 6—6 of FIG. 2.

FIG. 6 is a side cross-sectional view taken along lines 6—6 of FIG. 2 of the encapsulation device 10 is depicted in the second process position 90. The door 56 is closed hermetically sealing the interior of the encapsulation device 10 and can be subjected to inert atmosphere under vacuum conditions. The lower vacuum platen 38 is depicted in the raised position against lower platen stops 40. The spring plungers 54 is partially compressed and in contact with vacuum plate frame 48. The spring plungers 54 establishes an equal gap between the lower vacuum platen 22 and the transparent upper vacuum plate 20. This prevents the OLED device 34 with the adhesive 36 from contacting the transparent encapsulation cover 32 prior to encapsulation.

FIG. 7 is a cross-section view taken along lines 7—7 of FIG. 2 of the encapsulation device 10 is depicted in a third process position 92, the encapsulation position. The lower platen 38 stopped at lower platen stops 40. The encapsulation cylinder 26 is extended raising the lower platen 38 mounted on the lower vacuum supports 60 upward on the guide pins 62. The OLED device 34 with the adhesive 36 is raised and contacts the transparent encapsulation cover 32. The adhesive 36 is compressed and the vacuum allows the gases trapped between the OLED device 34 and the transparent encapsulation cover 32 to equalize preventing an over pressure condition within the encapsulated OLED device 84. The encapsulated OLED device 84 is then subjected to ultra violet light provided by the adhesive cure station 70 of FIG. 1. The encapsulated OLED device 84 is exposed to the ultra violet light through the transparent upper vacuum plate 20.

The encapsulation device 10 returns to the first process position 88 and the encapsulated OLED device 84 is removed using robotic arm 76 and placed in the storage cassette 74 of FIG. 1.

The invention has been described in detail with particular reference to certain preferred embodiments thereof, but it will be understood that variations and modifications can be effected within the spirit and scope of the invention.

PARTS LIST

10 encapsulation device
20 transparent upper vacuum plate
22 lower vacuum plate
24 transport cylinder
26 encapsulation cylinder
28 die pin
30 pressure transducer
32 transparent encapsulation cover
34 OLED device
36 adhesive
38 lower platen
40 lower platen stop
42 base plate
44 left hand side plate
46 right hand side plate
48 vacuum plate frame
50 front cover
52 rear cover
54 spring plungers
56 door
58 fastener
60 lower vacuum support
62 guide pin
70 adhesive cure station
72 adhesive dispenser
74 storage cassette
76 robotic arm
78 alignment fixture
80 transport conveyor
82 pick-up tool
84 encapsulated OLED device
86 door cylinder
88 first process position
90 second process position
92 third process position

What is claimed is:

1. A method for encapsulating one or more OLED devices with an transparent encapsulation cover, comprising the steps of:

(a) placing an OLED device onto an alignment fixture;

(b) after the OLED device is aligned on the alignment fixture removing the aligned OLED device and placing the OLED device at an adhesive receiving position;

(c) using an adhesive dispenser to dispense adhesive at the adhesive receiving position at one or more predetermined locations on the OLED device;

(d) removing the adhesive containing OLED device from the adhesive dispenser and placing the adhesive containing OLED device in an encapsulation device;

(e) removing an transparent encapsulation cover from a storage cassette and positioning the transparent encapsulation cover in the alignment fixture; and (f) moving the transparent encapsulation cover into an engaging relationship with the adhesive on the OLED device to secure the transparent encapsulation cover onto the OLED device.

2. The method of claim 1 wherein step (e) includes causing a hold down vacuum to position the transparent encapsulation cover relative to the OLED device.

3. The method of claim 1 further including providing a robotic arm with a pick-up tool for performing step (a) and using the pick-up tool of the robotic arm to remove the transparent encapsulation cover from a storage cassette and position such removed transparent encapsulation cover in the encapsulation device.

4. The method of claim 3 further including using the pick-up tool to place the transparent encapsulation cover in the alignment fixture prior to moving the transparent encapsulation cover to the encapsulation device.

5. The method of claim 1 further including providing an inert atmosphere in the encapsulation device so that the inert atmosphere is captured between the transparent encapsulation cover and the OLED) device.

6. The method of claim 5 wherein the inert atmosphere is nitrogen.

* * * * *